(12) United States Patent
Katayama

(10) Patent No.: US 9,258,887 B2
(45) Date of Patent: Feb. 9, 2016

(54) PRINTED CIRCUIT BOARD

(71) Applicant: YAZAKI CORPORATION, Tokyo (JP)

(72) Inventor: Yasushi Katayama, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 280 days.

(21) Appl. No.: 14/016,348

(22) Filed: Sep. 3, 2013

(65) Prior Publication Data

US 2014/0060892 A1 Mar. 6, 2014

(30) Foreign Application Priority Data

Aug. 31, 2012 (JP) .................. 2012-192356

(51) Int. Cl.
*H05K 1/00* (2006.01)
*H05K 1/02* (2006.01)
*H05K 3/00* (2006.01)

(52) U.S. Cl.
CPC ............ *H05K 1/0271* (2013.01); *H05K 3/0005* (2013.01); *H05K 2201/0969* (2013.01); *H05K 2201/09227* (2013.01); *H05K 2201/09781* (2013.01)

(58) Field of Classification Search
CPC .................... H05K 1/0271; H05K 2201/09663
See application file for complete search history.

(56) References Cited

U.S. PATENT DOCUMENTS

| | | | | |
|---|---|---|---|---|
| 6,285,080 B1 * | 9/2001 | Bezama | ............... | H01L 21/4857 257/690 |
| 6,356,451 B1 * | 3/2002 | Nakagawa | ........... | H05K 1/0271 174/250 |
| 6,639,154 B1 * | 10/2003 | Cartier et al. | ................. | 174/255 |
| 2004/0084205 A1 * | 5/2004 | Chang et al. | .................. | 174/250 |
| 2007/0089290 A1 * | 4/2007 | Lauffer et al. | .................. | 29/830 |
| 2009/0114429 A1 * | 5/2009 | Sri-Jayantha | ..... | H01L 23/49833 174/255 |
| 2010/0116530 A1 * | 5/2010 | Okazaki | ............... | H05K 3/4688 174/257 |
| 2010/0263914 A1 * | 10/2010 | Yao | ................... | H01L 23/49838 174/250 |
| 2012/0103664 A1 * | 5/2012 | Frosch | ..................... | H05K 1/02 174/251 |
| 2012/0235141 A1 * | 9/2012 | Masubuchi | .......... | H05K 1/0271 257/48 |

FOREIGN PATENT DOCUMENTS

| JP | 2002-261402 A | 9/2002 |
|---|---|---|
| JP | 2009-267162 A | 11/2009 |

* cited by examiner

*Primary Examiner* — Steven T Sawyer

(74) *Attorney, Agent, or Firm* — Kenealy Vaidya LLP

(57) ABSTRACT

A printed circuit board is designed to meet the following requirements. A front-back copper foil residual rate difference a−b falls within a range of −10% to 10%, where the insulative board is divided into a plurality of divisions, in which front and back surface copper foil residual rates of each division are a % and b %, respectively. A difference (a−b)−(c−d) between front-back copper foil residual rate differences of adjacent divisions falls within a range of −10% to 10%, where the front and back surface copper foil residual rates of a division adjacent to the each division are c % and d %, respectively. There are not three or more consecutive divisions for which the difference between the front-back copper foil residual rate differences goes beyond a range of −5% to 5%.

7 Claims, 10 Drawing Sheets

FIG.4A

FRONT SURFACE

| (11) 60% | (12) 55% | (13) 40% | (14) 60% | | |
|---|---|---|---|---|---|
| (21) 50% | (22) 40% | (23) 45% | (24) 55% | | |
| (31) 45% | (32) 45% | (33) 60% | (34) 45% | | |
| | | | | | |

FIG.4B

FRONT SURFACE

| (11) 60% | (12) 55% | (13) 40% | (14) 60% | | |
|---|---|---|---|---|---|
| (21) 50% | (22) 25% | (23) 45% | (24) 55% | | |
| (31) 45% | (32) 45% | (33) 70% | (34) 45% | | |
| | | | | | |

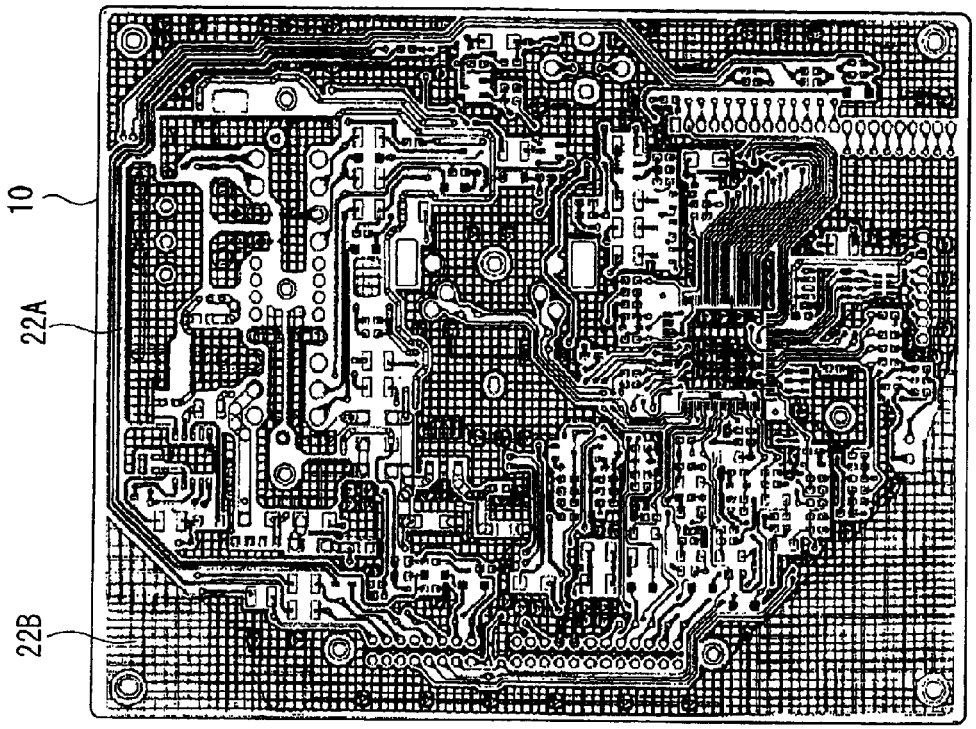

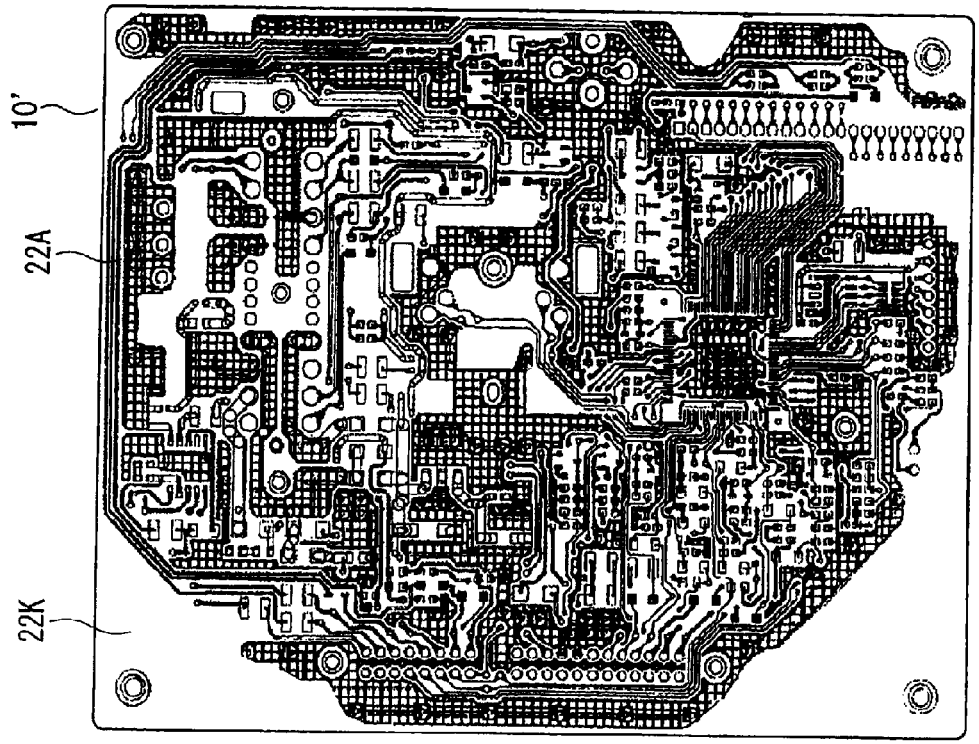
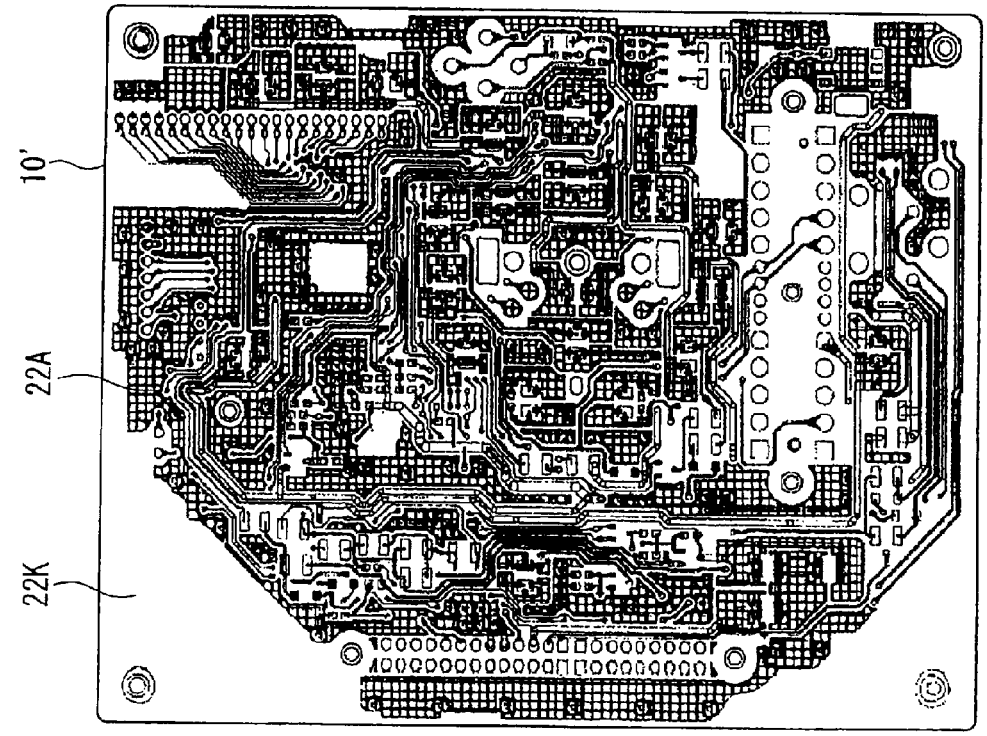
FIG.7A
FIG.7B

FIG. 8
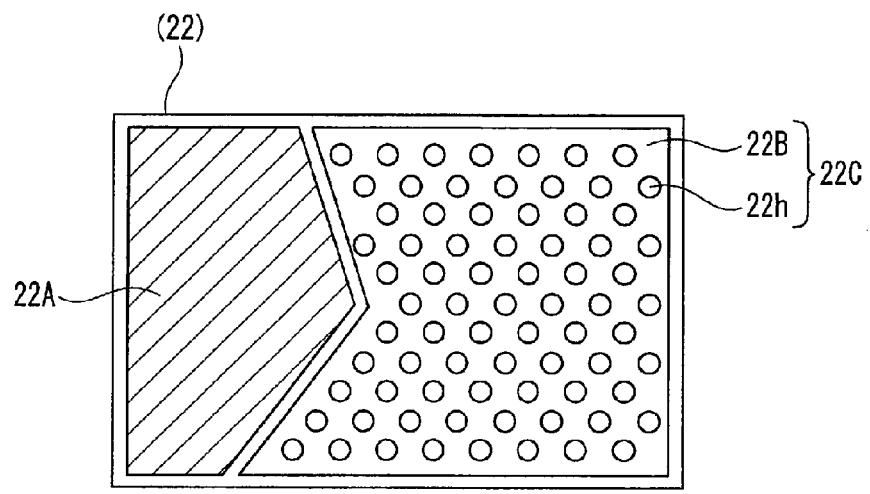
FIG. 9A  FIG. 9B  FIG. 9C
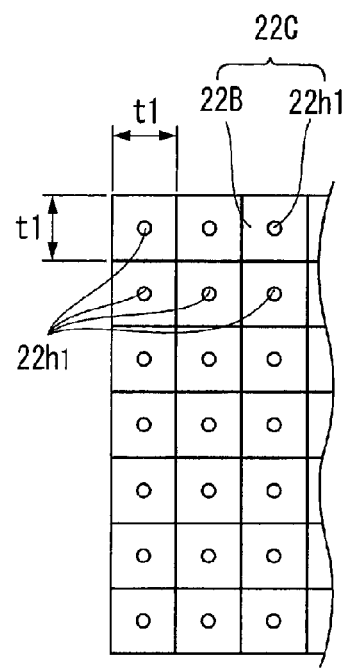 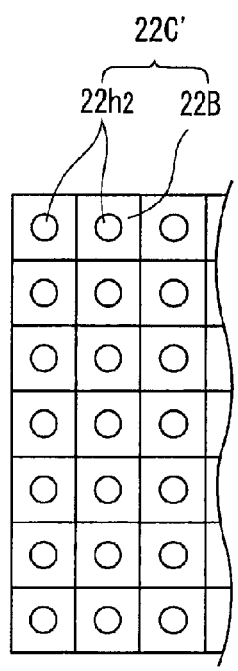 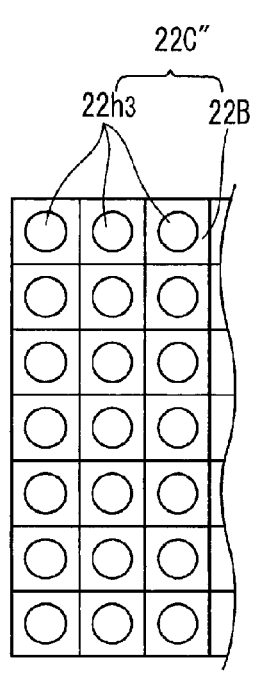
t1=5mm
φ22h1=1mm
φ22h2=2mm
φ22h3=3mm

PRINTED CIRCUIT BOARD

CROSS-REFERENCE TO RELATED APPLICATIONS

This application is based upon and claims the benefit of priority of Japanese Patent Application No. 2012-192356 filed on Aug. 31, 2012, the contents of which are incorporated herein by reference in its entirety.

BACKGROUND OF THE INVENTION

1. Field of the Invention

The present invention relates to a printed circuit board in which a circuit pattern is formed, and particularly relates to a printed circuit board for which the warpage can be reduced even if a phenolic paper substrate is used.

2. Background Art

<A Traditional Printed Circuit Board>

When the pattern of a printed circuit board is designed, traditionally, no limit is set in the ratio of copper foils formed on the front surface and the back surface of the circuit board or copper foil balance.

<In the Case of a Phenolic Paper Substrate>

However, when a phenolic paper substrate (FR1) is used, the board is warped when the traditional pattern design method is used. If the board is being warped, when components are mounted, the following problems will happen. For example, the component is not well soldered, or the component is not in an automatic soldering reflow groove. Moreover, stress among the mounted component, the soldering part and the copper foil is produced due to the warp after the solder is solidified in the reflow groove.

<Related Arts to Prevent a Warp of the Circuit Board>

As a circuit board in view of the above situation, JP-A-2002-261402 discloses to prevent the warp of a circuit board as follows. According to JP-A-2002-261402, the overall area of the circuit pattern provided on the front surface of the circuit board is generally the same as the overall area of the circuit pattern provided on the back surface of the circuit board.

Thereby, the warp of the circuit board becomes extremely small. When an electric component is soldered, the electric component can be soldered surely. Meanwhile, the solder of the electric component can be prevented from being stripped when the electric component is soldered to a mother board or in use.

<Problems of JP-A-2002-261402>

In the method described in JP-A-2002-261402, the overall area of the circuit pattern on the front surface is generally the same as the overall area of the circuit pattern on the back surface, but in many cases, the circuit patterns are formed with sparse parts and dense parts. Therefore, even if the overall areas of the circuit patterns on the front surface and the back surface are the same, it naturally occurs that the sparse part of the circuit pattern on the front surface may correspond to the dense part of the circuit pattern on the back surface, or the dense part of the circuit pattern on the front surface may correspond to the sparse part of the circuit pattern on the back surface. In such a case, a deformation occurs between the front surface and the back surface, and a warp occurs.

<Related Art 2 to Prevent a Warp of the Circuit Board>

JP-A-2009-267162 also discloses to prevent a warp of the circuit board as follows. According to JP-A-2009-267162, a circuit pattern which includes a solid pattern for power supply is formed on the front surface of the circuit board, a circuit pattern which includes a solid pattern for grounding is formed on the back surface of the circuit board, and a plurality of holes are formed in the solid patterns in areas where the two solid patterns are not overlapped (in a top view) to alleviate the stress and control the warp.

<Problems of JP-A-2009-267162>

According to the method described in JP-A-2009-267162, for the solid patterns in the areas where the two solid patterns are not overlapped (in a top view) the stress is alleviated so that the deformation is hard to occur. In areas, however, where the two solid patterns are overlapped in a top view, circuit patterns which include the solid patterns are formed respectively. Since it also naturally occurs that the dense part of the circuit pattern on the back surface may correspond to the sparse part of the circuit pattern on the front surface, like JP-A-2002-261402, deformation in the parts occurs, and a warp occurs.

SUMMARY OF THE INVENTION

The present invention is made to solve the above problems, and a non-limited object of the present invention is to eliminate a density difference between the front surface and the back surface to prevent the warp of a circuit board from occurring by applying the substantially similar percentage of copper foil to the circuit pattern on the back surface of the printed circuit board as that of the copper foil applied to the circuit pattern on the front surface.

A printed circuit board according to aspects of the present invention is mentioned, for example, as follows.

(1) A printed circuit board, including:

a flat insulative board;

a first circuit pattern provided on a front surface of the insulative board; and a second circuit pattern provided on a back surface of the insulative board, wherein the printed circuit board is designed to meet following requirements:

a front-back copper foil residual rate difference (a–b) falls within a range of –10% to 10%, where the insulative board is divided into a plurality of divisions in a top view, in which a front surface copper foil residual rate and a back surface copper foil residual rate of each division are a % and b %, respectively;

a difference ((a–b)–(c–d)) between front-back copper foil residual rate differences of adjacent divisions falls within a range of –10% to 10%, where the front surface copper foil residual rate and the back surface copper foil residual rate of a division adjacent to the each division are c % and d %, respectively; and there are not three or more consecutive divisions for which the difference ((a–b)–(c–d)) between the front-back copper foil residual rate differences goes beyond a range of –5% to 5%.

(2) The printed circuit board according to the configuration (1), wherein a value (a–c) falls within a range of –20% to 20% and a value (b–d) falls within a range of –20% to 20%.

(3) The printed circuit board according to the configuration (2), wherein a difference ((a–b)–(c–d)) between the front-back copper foil residual rate differences of a first division under a surface mounted component which is soldered in more than one division and a second division adjacent to the first division falls within a range of –5% to 5%.

(4) The printed circuit board according to any one of the configurations (1) to (3), wherein a solid copper foil is filled in a place with a lower copper foil residual rate than a predetermined rate to adjust the copper foil residual rate in each division.

(5) The printed circuit board according to the configuration (4), wherein a number of holes are opened in the solid copper foil to reduce a stress of the solid copper foil.

(6) The printed circuit board according to the configuration (5), wherein a size of the holes is any of 1 mm to 3 mm in diameter in a 5 mm*5 mm square.

(7) The printed circuit board according to any one of the configurations (1) to (6), wherein it is permitted that there are three consecutive divisions for which the difference ((a−b)−(c−d)) between the front-back copper foil residual rate differences of adjacent divisions goes beyond the range of −5% to 5% in a vertical direction or in a horizontal direction on a plane of the insulative board if the adjacent divisions are at one end of the insulative board.

According to the above configuration (1), since an insulative board is divided into a plurality of divisions in a top view, where the front-back copper foil residual rate difference falls within a range of −10% to 10% in each division, a big density difference between the front surface and the back surface in each division is eliminated so that a big warp is not produced. Since the difference between the front-back copper foil residual rate difference of adjacent divisions is small, a big warp is not produced at the adjacent divisions. Since there are not three or more consecutive divisions for which the difference between the front-back copper foil residual rate differences of adjacent divisions goes beyond a range of −5% to 5%, a big warp can be prevented from occurring as a whole.

According to the above configuration (2), since the copper foil residual rate difference of adjacent divisions falls within the range of −20% to 20%, a big density difference at the division border is eliminated and the imbalance at the division border is reduced.

According to the above configuration (3), since the difference between the front-back copper foil residual rate differences of the first division under a surface mounted component which is soldered in more than one division and the second division adjacent to the first division falls within the range of −5% to 5%, a big density difference at the division border is almost eliminated, the imbalance at the division border can be reduced and the soldering can be performed precisely.

According to the above configuration (4), since the solid copper foil is filled in the place with a lower copper foil residual rate than a predetermined rate to adjust the copper foil residual rate in each division, the copper foil in each division can be not uneven and the imbalance in each division is reduced.

According to the above configuration (5), a number of holes are opened in the solid copper foil of the above configuration (4) to reduce the stress of the solid copper foil so that the copper foil balance can be adjusted.

According to the above configuration (6), the copper foil balance can be efficiently and precisely adjusted by assuming the holes of the above configuration (5) to have a diameter of any of 1 mm to 3 mm in a 5 mm*5 mm square.

According to the above configuration (7), because the end of the insulative board is forcibly fixed to an external object, there is no problem even there are several consecutive concave/convex warps, and on the other hand, in this way, the confirmation time for pattern design can be reduced.

BRIEF DESCRIPTION OF THE DRAWINGS

In the accompanying drawings.

FIG. 4A is a top view of a printed circuit board according to second embodiment of the present invention;

FIG. 4B is a top view of the traditional printed circuit board;

FIGS. 6A and 6B are top views of a real printed circuit board of the third embodiment of the present invention, in which FIG. 6A shows the front surface and FIG. 6B shows the back surface;

FIGS. 7A and 7B are top views of a real traditional printed circuit board, in which FIG. 7A shows the front surface and FIG. 7B shows the back surface;

FIG. 8 is a top view of a printed circuit board according to a variation 1 of the third embodiment of the present invention;

FIGS. 9A to 9C are partial top views of a printed circuit board according to a variation 2 of the third embodiment 3 of the present invention.

DETAILED DESCRIPTION OF THE EXEMPLARY EMBODIMENTS

Aspects of the present invention which is effectively applied to a printed circuit board, particularly to a board whose material is FR1 or FR2, to prevent a big warp from occurring will be described in detail with reference to the figures as follows.

<The Printed Circuit Board According to a First Embodiment of the Present Invention>

Figure 1A:
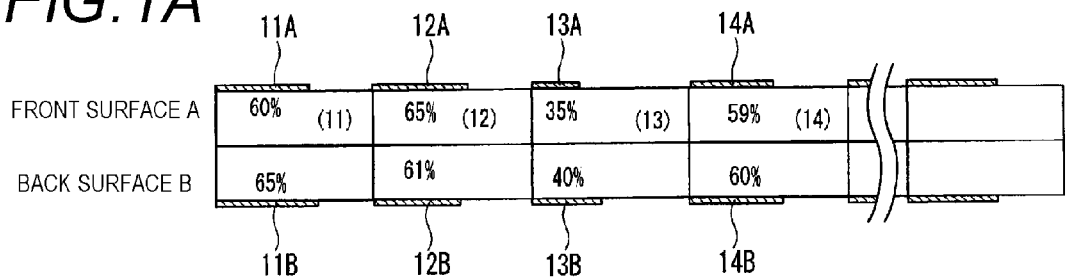
FIGS. 1A to 1C are longitudinal sectional view of a printed circuit board according to a first embodiment of the present invention.
Figure 1B:
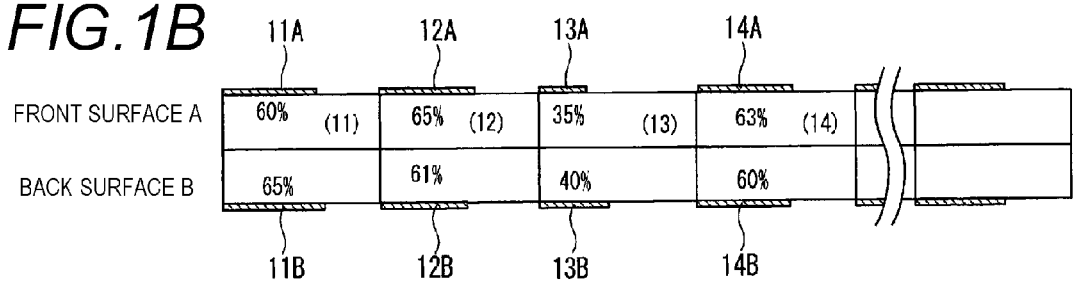
Figure 1C:
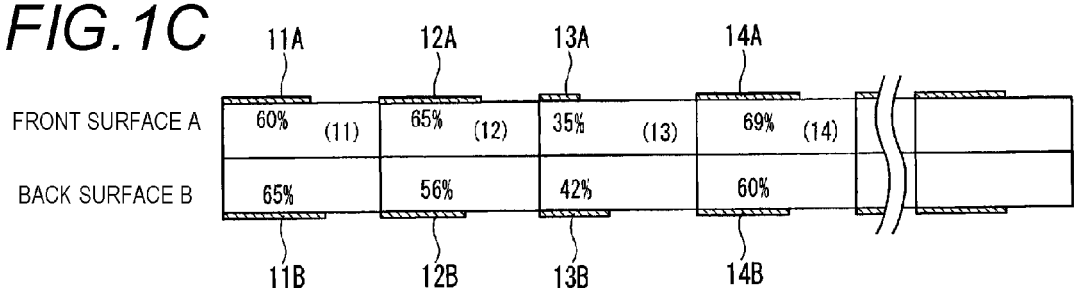

FIGS. 1A to 1C are longitudinal sectional views of the printed circuit board according to the first embodiment of the present invention.

The first embodiment includes three features (i) to (iii).
<The Feature (i) of the First Embodiment: FIG. 1C>
The feature (i) of the first embodiment is that where one printed circuit board, when viewed from the top, is equally divided into divisions with a plurality of vertical straight lines and horizontal straight lines, the copper foil residual rate difference between the front surface and the back surface of each division, which is a square of about 30 mm*30 mm, falls within a range of −10% to 10%, or the absolute value does not exceed 10%.

FIG. 1C is a diagram in which the feature (i) is carried out.
<Size of Each Division>
In FIG. 1C, the size of each one division (a division) is preferred to be around 30 mm*30 mm.

Where the board has a size of 320 mm*130 mm, in order to divide one side (320 mm) of the board into sections of around 30 mm, by calculating the expression "320/30=10.666" and rounding the quotient to a whole number, 11 sections are obtained.

When one side (320 mm) of the board is divided into 11 sections, by calculating the expression "320/11=29.09 mm", one side of the division is made to be 29.09 mm.

Similarly, when the other side (130 mm) of the board is divided into sections of around 30 mm, by calculating the expression "130/30=4.333" and rounding the quotient to a whole number, 4 sections are obtained.

When the other side (130 mm) of the board is divided into 4 sections, by calculating the expression "130/4=32.5 mm", the other side of the division is made to be 32.5 mm.

In this way, the long side of the board of the size of 320 mm*130 mm is divided into 11 sections and the short side of the board is divided into 4 sections so that 44 divisions of 29.09 mm*32.5 mm are obtained.

<The Copper Foil Residual Rate Difference Between the Front Surface and the Back Surface in Each Division>

FIG. 1C shows the respective copper foil residual rates of the divisions which are decided as above in a longitudinal sectional view of a certain line. The sign A indicates the front surface and the sign B indicates the back surface.

The number recorded in each division is the copper foil residual rate (copper foil rate) (%) which means the area the copper foil occupies in the area of the division. The copper foil residual rate is obtained from the ratio of the area the copper foil occupies in the area of the division to the area of the division.

For example, in FIG. 1C, the copper foil residual rate of the front surface A in a left side division 11 is 60%. The horizontal length of 11A in the figure shows the total copper foil quantity (copper foil residual quantity) in the division 11. The whole length that extends from the left to the right of one division means 100%, and a half length means 50%.

Similarly, the copper foil residual rate of a division 12 which is the second division from the left on the front surface A is 65%, the copper foil residual rate of a division 13 which is the third division from the left is 35%, and the copper foil residual rate of a division 14 which is the fourth division from the left is 69%.

The copper foil residual rate of the left side division 11 on the back surface B is 65%. The horizontal length of 11B in the figure shows the total copper foil quantity (copper foil residual quantity) in the division 11.

Similarly, the copper foil residual rate of a division 12 which is the second division from the left on the back surface B is 56%, the copper foil residual rate of a division 13 which is the third division from the left is 42%, and the copper foil residual rate of a division 14 which is the fourth division from the left is 60%.

<The Copper Foil Residual Rate Difference Between the Front Surface and the Back Surface Falls within a Range of −10% to 10%>

The copper foil residual rate difference between the front surface and the back surface of the division 11 is 60%−65%=−5%, the copper foil residual rate difference of the second division 12 is 65%−56%=9%, the copper foil residual rate difference of the third division 13 is 35%−42%=−7%, and the copper foil residual rate difference of the fourth division 14 is 69%−60%=9%. All fall within a range of −10% to 10%.

According to the feature (i) of the first embodiment of the present invention, the copper foil residual rate difference between the front surface A and the back surface B in the same division falls within a range of −10% to 10%.

Since the copper foil residual rate difference between the front surface and the back surface falls within a range of −10% to 10%, the copper foil residual rate difference between the front surface and the back surface is small so that there is no big difference in thermal expansion rate between the front surface and the back surface, the warpage of the printed circuit board is reduced, and when components are mounted, the following problems will not happen. For example, the component is not well soldered, or the component is not in an automatic soldering reflow groove.

<The Traditional Printed Circuit Board>

Figure 1D:
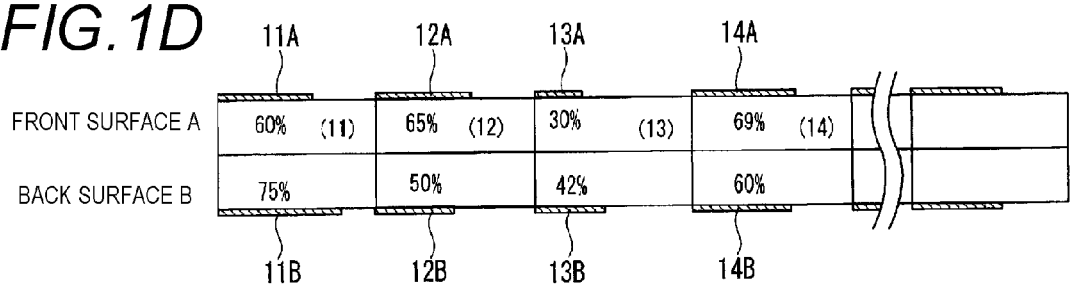
FIG. 1D is a longitudinal sectional view of a traditional printed circuit board.

In contrast, FIG. 1D is a longitudinal sectional view of the traditional printed circuit board for which such a copper foil residual rate difference is not considered.

In FIG. 1D, the copper foil residual rate of a left side division 11 on the front surface A is 60%, the copper foil residual rate of the second division 12 is 65%, the copper foil residual rate of the third division 13 is 30%, and the copper foil residual rate of the fourth division 14 is 69%.

On the other hand, the copper foil residual rate of the left side division 11 on the back surface B is 75%, the copper foil residual rate of the second division 12 is 50%, the copper foil residual rate of the third division 13 is 42%, and the copper foil residual rate of the fourth division 14 is 60%.

The copper foil residual rate difference between the front surface and the back surface of the division 11 is 60%−75%=−15%, the copper foil residual rate difference of the second division 12 is 65%−50%=15%, the copper foil residual rate difference of the third division 13 is 30%−42%=−12%, and the copper foil residual rate difference of the fourth division 14 is 69%−60%=9%.

The absolute value of the copper foil residual rate difference between the front surface and the back surface of the division 11 is 15%, the absolute value of the copper foil residual rate difference between the front surface and the back surface of the second division 12 is 15%, the absolute value of the copper foil residual rate difference between the front surface and the back surface of the third division 13 is 12%, and therefore the absolute value of the copper foil residual rate difference of these three divisions all exceeds 10%.

When the absolute value of the copper foil residual rate difference between the front surface and the back surface exceeds 10%, there is a remarkable difference in thermal expansion rate between the front surface and the back surface, and the warpage exceeds 1 mm. In the traditional printed circuit board, as the warpage exceeds 1 mm, when components are mounted, there are the following problems. For example, the component is not well soldered, or the component is not in an automatic soldering reflow groove.

The relation between the copper foil residual rate difference between the front surface and the back surface and the warpage is investigated herein.

<The Relation Between the Copper Foil Residual Rate Difference and the Shrinkage Ratio of an FR1 Substrate>

The relation between the copper foil residual rate difference and the shrinkage ratio of the FR1 substrate in use should be obtained by an experiment beforehand.

<In the Case of the FR1 Substrate Having the Side Length of 330 mm>

The experiment result of a square FR1 substrate (399W board), whose side length is 330 mm and whose board thickness is 1.6 mm, is that as shown in the Table 1. Where the copper foil residual rate differences between the front surface and the back surface are 1%, 2%, 3%, 5%, 10%, 20% and 30%, the shrinkage ratios of the FR1 substrate are 0.006%, 0.007%, 0.008%, 0.012%, 0.02%, 0.05% and 0.07%, respectively.

TABLE 1

Board of a side length of 330 mm and of a thickness of 1.6 mm (399W board)

| copper foil residual rate difference (%) | shrinkage ratio (%) | outer circular arc d (mm) board width | incomplete circle height h (warpage amount) (mm) |
|---|---|---|---|
| 30 | 0.07 | 330 | 5.954891046 |
| 20 | 0.05 | 330 | 4.252478966 |
| 10 | 0.02 | 330 | 1.701062794 |
| 5 | 0.012 | 330 | 1.020731561 |
| 3 | 0.008 | 330 | 0.680527682 |
| 2 | 0.007 | 330 | 0.595471258 |
| 1 | 0.006 | 330 | 0.51041238 |

<The Warpage Amount h is Obtained when 4 Parameters are Determined>

Figure 2:
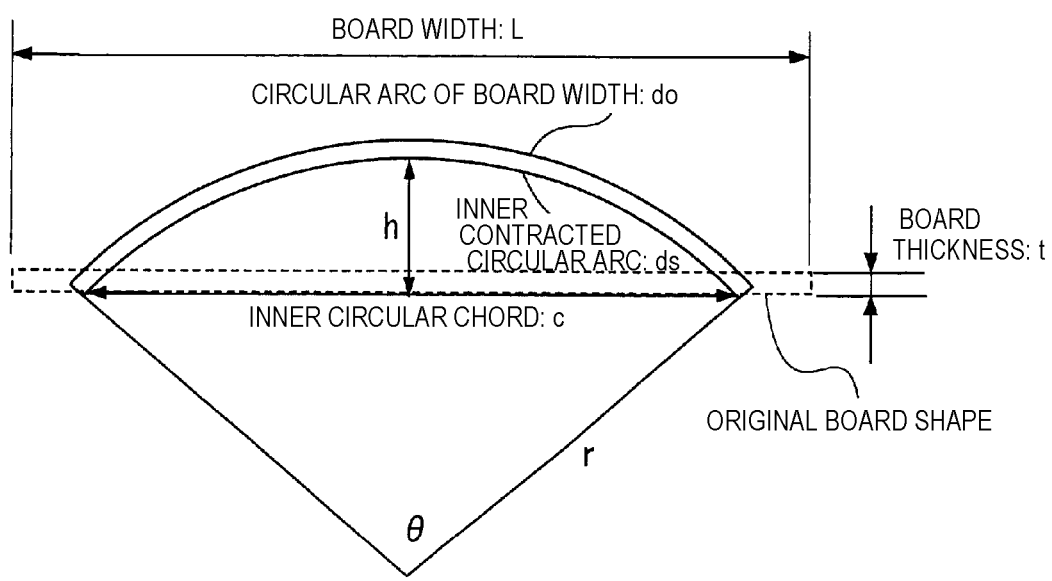
FIG. 2 is a schematic diagram for calculating the warpage of the printed circuit board in embodiments of the present invention.

FIG. 2 is a schematic diagram for calculating the warpage amount of the printed circuit board of the present invention.

In FIG. 2, when (1) a side length L of the board, (2) the board thickness t, (3) the copper foil residual rate Rs and (4) the shrinkage ratio Ss are known, the warpage amount h can be obtained as follows.

In FIG. 2, the slim rectangle as shown by dotted lines is the original flat FR1 board before the warp, and the curved rectangle surrounded by an outer circular arc do and an inner circular arc ds is the FR1 board which is warped.

L is one side length of the printed circuit board which is 330 mm.

t is the board thickness of the board, and herein, t=1.6 mm.

The curved rectangular FR1 board which is warped can be seen as part of a circular arc.

The length of the outer circular arc do is the board side length L, and the length of the inner circular arc ds is a length after the board shrank ((1−shrinkage ratio)*L)).

h is the warpage amount (incomplete circle height).

r is the radius of the outer circular arc do, and c is the inner circular chord.

The shrinkage ratio α when the copper foil residual rate difference is 15% can be calculated as approximately 0.03% by interpolation from those when the copper foil residual rate difference is 10% (the shrinkage ratio is 0.02%) and when the copper foil residual rate difference is 20% (the shrinkage ratio is 0.05%) in Table 1.

1) First, the radius r of the outer circular arc do is obtained.

$$r:L=(r-t):L*(1-\alpha)$$

$$r:330=(r-1.6):330*(1-0.0003) \quad \text{Formula (I)}$$

From Formula (1), r=5333.333 (mm) is obtained.

2) Next, the inner circle circumference Ls is obtained from r.

$$Ls = 2\pi*(r-1.6)$$
$$= 2\pi*(5333.333-1.6)$$
$$= 33500.26845 (mm)$$

3) The central angle θ of the inner circular arc ds is obtained from Ls.

$$\theta = (\text{the inner circular arc } ds/\text{the inner circle circumference } Ls)*360°$$
$$= \left(\frac{329.901}{33500.26845}\right)*360°$$
$$= 3.545176°$$

4) The inner circular chord c is obtained from the inner circle circumference Ls.

$$c = [(r-t)*\sin(\theta/2)]*2$$
$$= [(r-1.6)*\sin(\theta/2)]*2$$
$$= 329.69054 (mm)$$

5) The warpage amount h is obtained from the inner circular chord c by using Pythagorean Theorem.

$$(r-1.6)^2 = (c/2)^2 + [(r-1.6)-h]^2$$
$$h = r - (4r^2 - c^2)^{1/2}$$
$$= 5333.333 - (4*5333.333^2 - 329.69054^2)^{1/2}$$
$$= 2.5514 (mm)$$

The warpage amount is obtained from the copper foil residual rate difference like above.

<In the Case of the Board Width L=330 mm>

From the above calculations, where the board width L=330 mm, the board thickness t=1.6 mm, and the copper foil residual rates Rs are 1%, 2%, 3%, 5%, 10%, 20% and 30%, respectively, the warpage amounts h are roughly 0.51 mm, 0.60 mm, 0.68 mm, 1.02 mm, 1.70 mm, 4.25 mm and 5.95 mm, respectively, as shown in Table 1.

<In the Case of the Board Width L=243 mm>

Where the board width L=243 mm and the other conditions are the same (the board thickness t=1.6 mm, and the copper foil residual rates Rs are 1%, 2%, 3%, 5%, 10%, 20%, and 30%, respectively), the warpage amounts h are calculated similarly, and the warpage amounts h are roughly 0.28 mm, 0.32 mm, 0.37 mm, 0.55 mm, 0.92 mm, 2.31 mm and 3.23 mm, respectively, as shown in Table 2.

TABLE 2 board of a side length of 243 mm and of a thickness of 1.6 mm

| copper foil residual rate difference (%) | shrinkage ratio (%) | outer circular arc d (mm) board width | incomplete circle height h (warpage amount) (mm) |
|---|---|---|---|
| 30 | 0.07 | 243 | 3.227000791 |
| 20 | 0.05 | 243 | 2.305125788 |
| 10 | 0.02 | 243 | 0.922324773 |
| 5 | 0.012 | 243 | 0.55346301 |
| 3 | 0.008 | 243 | 0.369000607 |
| 2 | 0.007 | 243 | 0.322881291 |
| 1 | 0.006 | 243 | 0.27676041 |

<A Graph of the Copper Foil Residual Rate Difference and the Warpage>

Figure 3:
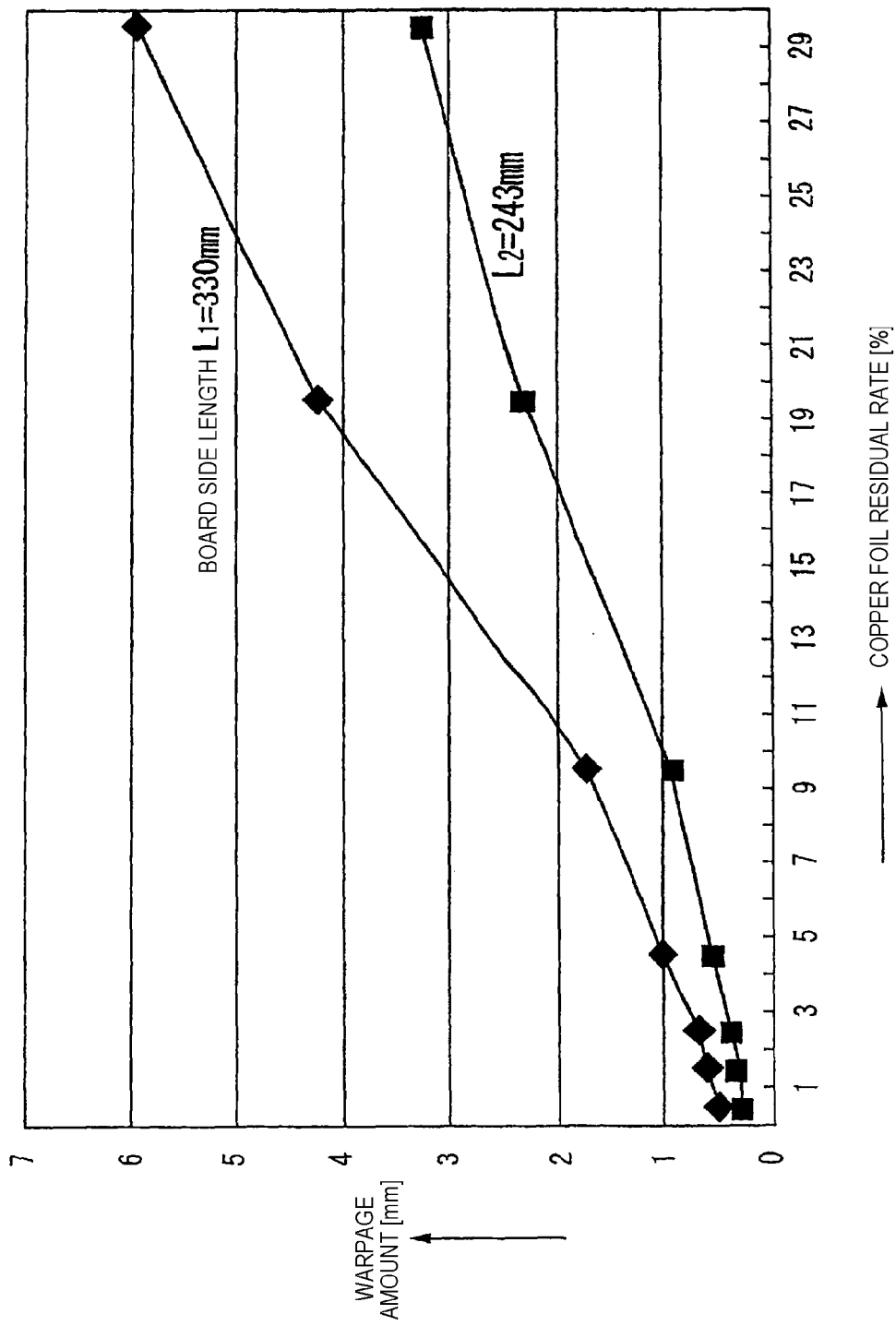
FIG. 3 is a graph, which shows the copper foil residual rate difference with respect to the warp of the printed circuit board, which is calculated by using the schematic diagram of FIG. 2.

FIG. 3 is a graph which can be easily understood and is made from Table 1 and Table 2.

FIG. 3 is a graph, which shows the copper foil residual rate difference to the warp of the printed circuit board, which is calculated by using the schematic diagram of FIG. 2, and in which the parameters are as follows: a side length L1 of the printed circuit board=330 mm, and L2=243 mm. As the copper foil residual rate difference increases in the horizontal axis, the warpage amount h continuously increases in the vertical axis. Since it is preferred to control the warpage amount to be under 1 mm to improve the reliability of the soldering in the reflow groove, where the board L1=330 mm, it is preferred for the copper foil residual rate difference Rs to be under 5%, and where the board L2=243 mm, it is preferred for the copper foil residual rate difference Rs to be under 10%.

<The Feature (ii) of the First Embodiment: FIG. 1B>

The feature (ii) of the first embodiment is that on the basis of meeting the requirement of the feature (i), furthermore, the difference between the front-back copper foil residual rate difference of one division and the front-back copper foil residual rate difference of a division adjacent to the one division falls within a range of −10% to 10%, or the absolute value does not exceed 10%.

FIG. 1B is a diagram in which the feature (ii) is carried out.

In FIG. 1B, the difference between the front-back copper foil residual rate difference of the division 11 and the front-back copper foil residual rate difference of the division 12 is calculated and obtained by (60%−65%)−(65%−61%)=−9%.

The difference between the front-back copper foil residual rate difference of the division 12 and the front-back copper foil residual rate difference of the division 13 is calculated and obtained by (65%−61%)−(35%−40%)=9%.

The difference between the front-back copper foil residual rate difference of the division 13 and the front-back copper foil residual rate difference of the division 14 is calculated and obtained by (35%−40%)−(63%−60%)=−8%.

Thus, the difference between the front-back copper foil residual rate difference of one division and the front-back copper foil residual rate difference of a division adjacent to the one division falls within a range of −10% to 10%. Thereby, if the warp of the one division and the warp of the adjacent division are small but in opposite directions, the warp becomes big as a whole, since the warps in opposite directions are eliminated, a big warp as a whole will not occur so that when components are mounted, the following problems will not happen. For example, the component is not well soldered, or the component is not in an automatic soldering reflow groove.

In contrast, in FIG. 1C of the feature (i), the difference between the front-back copper foil residual rate differences are not considered.

Therefore, the difference between the front-back copper foil residual rate difference of the division 11 and the front-back copper foil residual rate difference of the division 12 is calculated and obtained by (60%−65%)−(65%−56%)=−14%.

The difference between the front-back copper foil residual rate difference of the division 12 and the front-back copper foil residual rate difference of the division 13 is calculated and obtained by (65%−56%)−(35%−42%)=16%.

The difference between the front-back copper foil residual rate difference of the division 13 and the front-back copper foil residual rate difference of the division 14 is calculated and obtained by (35%−42%)−(69%−60%)=−16%.

When the warpage amounts in two adjacent divisions are small but in opposite directions, the warpage becomes big as a whole so that when components are mounted, there are the following problems. For example, the component is not well soldered, or the component is not in an automatic soldering reflow groove.

<The Feature (iii) of the First Embodiment: FIG. 1A>

The feature (iii) of the first embodiment is that there are not 3 or more consecutive divisions for which the difference between the front-back copper foil residual rate differences goes beyond a range of −5% to 5%, or the absolute value exceeds 5%, where the feature (ii) is carried out.

FIG. 1A is a diagram in which the feature (iii) is carried out.

In FIG. 1A, the difference between the front-back copper foil residual rate difference of the division 11 and the front-back copper foil residual rate difference of the division 12 is calculated and obtained by (60%−65%)−(65%−61%)=−9%.

The difference between the front-back copper foil residual rate difference of the division 12 and the front-back copper foil residual rate difference of the division 13 is calculated and obtained by (65%−61%)−(35%−40%)=9%.

The difference between the front-back copper foil residual rate difference of the division 13 and the front-back copper foil residual rate difference of the division 14 is calculated and obtained by (35%−40%)−(59%−60%)=−4%.

Thus, there are two consecutive divisions, the division 11 (−9%) and the division 12 (9%), for which the difference between the front-back copper foil residual rate differences goes beyond a range of −5% to 5%, but since the difference between the front-back copper foil residual rate differences for the next division 13 does not go beyond the range of −5% to 5% (−4%), a big warp as a whole can be prevented from occurring. Thereby, when components are mounted, the following problems will not happen. For example, the component is not well soldered, or the component is not in an automatic soldering reflow groove.

In contrast, since in FIG. 1B of the feature (ii) the differences between the front-back copper foil residual rate differences for three divisions are not considered like above, as calculated above, the difference between the front-back copper foil residual rate difference of the division 11 and the front-back copper foil residual rate difference of the division 12 is −9%, the difference between the front-back copper foil residual rate difference of the division 12 and the front-back copper foil residual rate difference of the division 13 is 9%, the difference between the front-back copper foil residual rate difference of the division 13 and the front-back copper foil residual rate difference of the division 14 is −8%, and therefore, there are three consecutive divisions for which the difference between the front-back copper foil residual rate differences goes beyond a range of −5% to 5%. Thus, a big warp as a whole cannot be prevented from occurring. Thereby, when components are mounted, there may be the following problems. For example, the component is not well soldered, or the component is not in an automatic soldering reflow groove.

<An Exception when there are Three Consecutive Divisions for which the Difference Goes Beyond a Range of −5% to 5%>

Even when there are three consecutive divisions for which the difference between the front-back copper foil residual rate differences of adjacent divisions in the vertical direction or the horizontal direction on the plane of the insulative board goes beyond a range of −5% to 5%, if the divisions are at an end of the insulative board, it does not matter that there are the three consecutive divisions. Because the end of the insulative board is forcibly fixed to an external object, there is no problem even there are several consecutive concave/convex warps, and on the other hand, in this way, the confirmation time for pattern design can be reduced.

That is, if the divisions in FIG. 1B are at an end of the insulative board, it is not necessary to modify like FIG. 1A, and there may be three consecutive divisions for which the difference goes beyond a range of −5% to 5%.

<The Printed Circuit Board According to a Second Embodiment of the Present Invention>

FIG. 4A is a top view of the printed circuit board according to a second embodiment of the present invention.

The second embodiment is characterized in that if one printed circuit board in a top view is divided into divisions with a plurality of vertical and horizontal straight lines, the copper foil residual rate difference between one square division and the adjacent division falls within a range of −20% to 20%, or the absolute value does not exceed 20%.

FIGS. 4A and 4B show a plurality of square divisions (30 mm*30 mm) for which the copper foil residual rates are decided in this way. The number recorded in each division is the copper foil residual rate (%) of the division.

For example, in FIG. 4A, the copper foil residual rate of an upper left division 11 is 60%. The copper foil residual rate of a division 12 which is to the right of the division 11 is 55%, the copper foil residual rate of a third division 13 is 40%, and the copper foil residual rate of a fourth division 14 is 60%.

Similarly, the copper foil residual rate of a left side division 21, which is on the second row from the top, is 50%, the copper foil residual rate of a division 22 which is to the right of the division 21 is 40%, the copper foil residual rate of a third division 23 is 45%, and the copper foil residual rate of a fourth division 24 is 55%.

Similarly, the copper foil residual rate of a left side division 31, which is on the third row from the top, is 45%, the copper foil residual rate of a division 32 which is to the right of the division 31 is 45%, the copper foil residual rate of a third division 33 is 60%, and the copper foil residual rate of a fourth division 24 is 45%.

<The Copper Foil Residual Rate Difference Between Adjacent Divisions Falls with a Range of −20% to 20%>

For example, when the copper foil residual rate differences between the division 22 and the adjacent divisions are obtained, the copper foil residual rate difference from the division 12, which is above the division 22 in the figure, is 15% (40% to 55%), the copper foil residual rate difference from the division 21, which is to the left of the division 22, is 10% (40% to 50%), the copper foil residual rate difference from the division 23, which is to the right of the division 22, is 5% (40% to 45%), and the copper foil residual rate difference from the division 32, which is below the division in the figure, is 5% (40% to 45%).

When the copper foil residual rate differences between the division 33 and the adjacent divisions are obtained, the copper foil residual rate difference from the division 23 above the division 33 is 15% (45% to 60%), the copper foil residual rate difference from the division 32 which is to the left of the division 33 is 15% (45% to 60%), and the copper foil residual rate difference from the division 34 which is to the right of the division 33 is 15% (45% to 60%).

The second embodiment of the present invention is characterized in that the copper foil residual rate difference between adjacent divisions falls within the range of −20% to 20%.

Thereby, a big density difference between divisions at division borders is eliminated, imbalance at the division borders is reduced, and the warpage of the printed circuit board can be reduced.

<The Traditional Printed Circuit Board>

FIG. 4B is a longitudinal sectional view of the traditional printed circuit board in which no consideration like above is made.

The copper foil residual rates of the divisions 11 to 34 in FIG. 4B are generally the same as the copper foil residual rates of the divisions 11 to 34 in FIG. 4A only except the division 22 and the division 33, as the copper foil residual rate of the division 22 is 25% and the copper foil residual rate of the division 33 is 70%.

<There are Some Copper Foil Residual Rate Differences in the Traditional Printed Circuit Board that Goes Beyond a Range of −20% to 20%>

When the copper foil residual rate differences between the division 22 and the adjacent divisions are obtained, the copper foil residual rate difference from the division 12 above the division 22 in the figure is 30% (55% to 25%), and the copper foil residual rate difference from the division 21 which is to the left of the division 22 is 25% (50% to 25%).

When the copper foil residual rate differences between the division 33 and the adjacent divisions are obtained, the copper foil residual rate difference from the division 23 above the division 33 is 25% (45% to 70%), the copper foil residual rate difference from the division 32 which is to the left of the division 33 is 25% (45% to 70%), and the copper foil residual rate difference from the division 34 which is to the right of the division 33 is 25% (45% to 70%).

Thus, in the traditional printed circuit board, there are some copper foil residual rate differences between adjacent divisions that go beyond the range of −20% to 20%.

When the copper foil residual rate difference goes beyond the range of −20% to 20%, a big density difference between the divisions at the division borders is produced, there is an imbalance at the division borders, the warpage of the printed circuit board will exceed 1 mm, and when components are mounted, there are the following problems. For example, the component is not well soldered, or the component is not in an automatic soldering reflow groove.

<The Copper Foil Residual Rate of Another Division from the Middle of One Division to the Middle of an Adjacent Division>

The precision is further improved when, for example, another two divisions are assumed from the middle of the division 22 to the middle of the division 23 and from the middle of the division 23 to the middle of the division 24, and the copper foil residual rate difference between the two assumed divisions also falls in the range of −20% to 20%.

<The Copper Foil Residual Rate Difference Between a Division in which Soldering is Performed and an Adjacent Division>

It is preferred that the copper foil residual rate differences between divisions on which a surface mounted component is soldered and adjacent divisions fall within a range of −5% to 5%. This is because it is required that the warpage at the site where the soldering is performed relative to a standard value is extremely small so that the soldering can be performed precisely.

<The Printed Circuit Board According to a Third Embodiment of the Present Invention>

<The Traditional Printed Circuit Board>

Figure 5A:
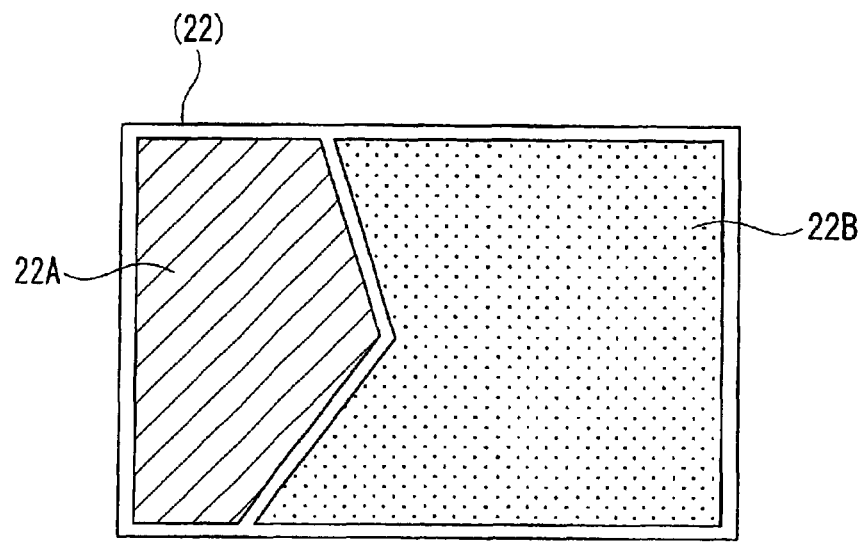
FIG. 5A is a conceptual top view of a printed circuit board according to a third embodiment of the present invention.
Figure 5B:
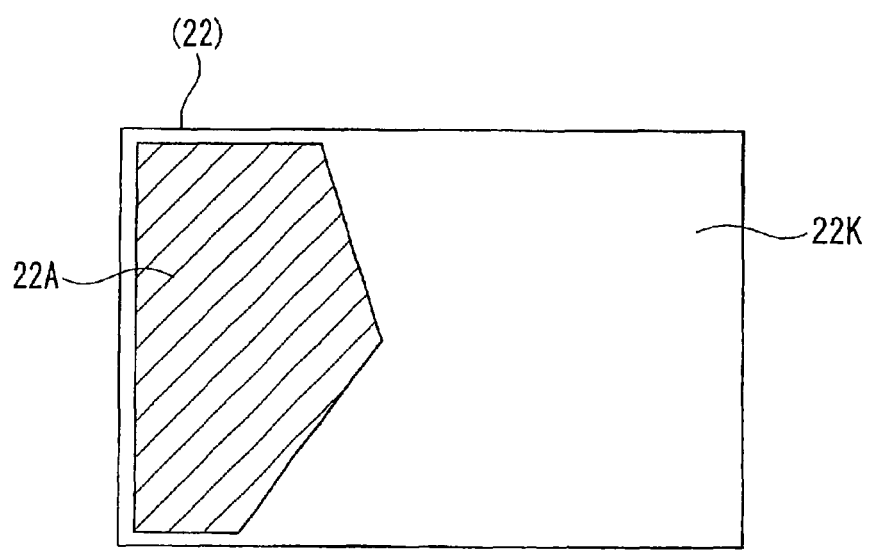
FIG. 5B is a conceptual top view of the traditional printed circuit board.

FIG. 5B is a conceptual top view of a division 22 of the traditional printed circuit board.

In FIG. 5B, in the division 22, a part 22A is a site where the copper foil is formed and a part 22K is another site where the copper foil is not formed.

Therefore, a big density difference is produced in one division based on whether there is copper foil, there is a remarkable difference in thermal expansion rate, there is imbalance in the division, a big warpage is produced, and when components are mounted, there are the following problems. For example, the component is not well soldered, or the component is not in an automatic soldering reflow groove.

<The Printed Circuit Board According to the Third Embodiment>

The third embodiment is characterized in that if the printed circuit board is divided into a plurality of divisions, and there is a place in one of the divisions where the copper foil residue rate is low (for example, a site where the copper foil residual rate is under 30%), a solid copper foil is filled in the place so that the copper foil in the division is not uneven.

FIG. 5A is a conceptual top view of the printed circuit board according to the third embodiment of the present invention.

In FIG. 5A, for example, in the division 22, a part 22A is a site where the copper foil is formed, and a part 22B is a solid copper foil which is filled in the site 22K (see FIG. 5B) where the copper foil is not formed.

Thereby, by forming the solid copper foil in the site where the copper foil is not formed, a big density difference of the copper foil in one division is eliminated, the imbalance in the division is eliminated, and the warpage of the printed circuit board can be reduced.

When there is no copper foil at all in one division, since a density difference of the copper foil is not produced, a solid copper foil is not necessary, but because there will be a problem of density difference if adjacent divisions have copper foils, it is preferred that the solid copper foil is filled even when there is no copper foil.

FIGS. 5A and 5B are conceptual top views of one division of the printed circuit board, and FIGS. 6A, 6B, 7A and 7B are top views of real printed circuit boards. FIGS. 6A and 6B show a real printed circuit board according to the third embodiment of the present invention, and FIGS. 7A and 7B shows a traditional printed circuit board. FIGS. 6A and 7A show the respective front surfaces, and FIGS. 6B and 7B show the respective back surfaces.

In a traditional printed circuit board 10' shown in FIGS. 7A and 7B, a part 22A is a site where the copper foil is formed, and in another site 22K the copper foil is not formed so that only the board is exposed.

Therefore, a big density difference is produced in one printed circuit board 10' based on whether there is copper foil, there is a remarkable difference in thermal expansion rate, there is imbalance in the division, a big warpage is produced, and when components are mounted, there are the following problems. For example, the component is not well soldered, or the component is not in an automatic soldering reflow groove.

In contrast, in a printed circuit board 10 shown in FIGS. 6A and 6B according to the third embodiment of the present invention, for both of a front surface (FIG. 6A) and a back surface (FIG. 6B), a part 22A is the copper foil and a part 22B is a solid copper foil which is filled in the site 22K (see FIGS. 7A and 7B) where the copper foil is not formed. The copper foil 22A is formed similarly on the back surface (FIG. 6B) in accordance with the copper foil 22A on the front surface (FIG. 6A), and a solid copper foil 22B is formed similarly on the back surface (FIG. 6B) in accordance with the solid copper foil 22B on the front surface (FIG. 6A).

Thereby, because a big density difference of the copper foil is not produced in one printed circuit board, the imbalance in the printed circuit board is eliminated, and the warpage of the printed circuit board can be reduced.

<A Variation 1 of the Third Embodiment>

In the variation 1, holes are opened in the solid copper foil provided in the third embodiment to adjust the copper foil residual rate in one division.

FIG. 8 is a top view of a printed circuit board according to the variation 1, in which the solid copper foil 22B is filled in a site other than the copper foil 22A according to the third embodiment. Thus, the solid copper foil 22B has a bigger copper foil density than that of the copper foil 22A, and a reverse density difference is produced. According to the variation 1, in such a case, a number of holes 22h are opened in the solid copper foil 22B to form a perforated copper foil 22C. In this way, the copper foil 22A in the division is balanced with the perforated copper foil 22C.

<A Variation 2 of the Third Embodiment>

In the variation 2, by varying the size of the holes of the solid copper foil provided in the variation 1, the copper foil residual rate in one division can be easily adjusted.

FIGS. 9A to 9C are top views of perforated copper foils 22C, 22C' and 22C" of the variation 2 according to the third embodiment, in which FIG. 9A shows the perforated copper foil 22C with holes whose diameter is 1 mm, FIG. 9B shows the perforated copper foil 22C' with holes whose diameter is 2 mm, and FIG. 9C shows the perforated copper foil 22C" with holes whose diameter is 3 mm.

Since the perforated copper foil 22C in FIG. 9A has holes whose diameter is 1 mm and which are opened in squares of sides of 5 mm, the area H of the holes=$0.5*0.5*\pi$ mm$^2$ and the copper foil area C is $5*5$ mm$^2$. Therefore, the copper foil residual rate is $100-[H/C*100]=97\%$.

Since the perforated copper foil 22C' in FIG. 9B has holes whose diameter is 2 mm, the area H of the holes=$1*1*\pi$ mm$^2$ and the copper foil area C is $5*5$ mm$^2$. Therefore, the copper foil residual rate is $100-[H/C*100]=88\%$.

Since the perforated copper foil 22C" in FIG. 9C has holes whose diameter is 3 mm, the area H of the holes=$1.5*1.5*\pi$ mm$^2$ and the copper foil area C is $5*5$ mm$^2$. Therefore, the copper foil residual rate is $100-[H/C*100]=72\%$.

Thus, the perforated copper foil 22C whose residual rate roughly corresponds to that of the copper foil 22A of the printed circuit board may be selected.

It is needless to say that a variation 3 is not limited to the three kinds of perforated copper foils 22C, 22C' and 22C", and it is also possible that a perforated copper foil 22C with holes whose diameter is 4 mm (copper foil residual rate=50%) or a perforated copper foil 22C with holes whose diameter is 4.8 mm (copper foil residual rate=28%) is used.

As described above, the first embodiment is performed on the front surface and the back surface of the printed circuit board, the second embodiment is performed on the adjacent divisions on the same surface (the front surface or the back surface), and the third embodiment is performed on the site where there is not much copper foil formed.

Thereby, the warpage can be reduced, and when components are mounted, the following problems will not happen. For example, the component is not well soldered, or the component is not in an automatic soldering reflow groove.

Table 3 is a warp state table of the printed circuit board on which the present invention is performed, and Table 4 is a warp state table of the printed circuit board on which a traditional example is performed.

<A Warp State Table of the Printed Circuit Board on which the Present Invention is Performed: Table 3>

Since the printed circuit board of the present invention is divided into a plurality of square divisions of about 30 mm*30 mm, equally divided marks are made in the X direction at X1 to X10, and equally divided marks are made in the Y direction at Y1 to Y5, and the warpage is calculated at each intersection point (X, Y).

The result is shown in Table 3.

TABLE 3

Warping state of the circuit board of the present invention

|    | X1       | X2       | X3       | X4       | X5       |
|----|----------|----------|----------|----------|----------|
| Y1 | −0.04815 | −0.03811 | 0.072738 | 0.016592 | 0.012872 |
| Y2 | −0.03458 | 0.025178 | −0.07328 | 0.067554 | 0.068338 |
| Y3 | 0.02935  | 0.07047  | 0.045698 | −0.07828 | −0.00756 |
| Y4 | 0.026664 | 0.03751  | −0.02786 | −0.02165 | 0.018778 |
| Y5 | −0.00723 | 0.05494  | 0.056066 | 0.047986 | 0.05182  |

|    | X6       | X7       | X8       | X9       | X10      |
|----|----------|----------|----------|----------|----------|
| Y1 | −0.07046 | 0.01992  | 0.08054  | −0.01018 | 0.071916 |
| Y2 | −0.01333 | 0.077478 | 0.03582  | 0.03979  | 0.00128  |
| Y3 | 0.024398 | 0.01725  | −0.05979 | 0.045298 | 0.037686 |
| Y4 | −0.04575 | 0.033582 | 0.02371  | 0.036632 | −0.00583 |
| Y5 | 0.08809  | 0.061512 | 0.09359  | −0.06945 | −0.07255 |

<There is No Spot where the Warpage Exceeds 0.1 Mm in Table 3>

The warpage at the intersection point (X1, Y1) is −0.04815 (in mm, the minus means the warpage is below the reference point), and below the warpages at the intersection point (X1, Y2), at the intersection point (X1, Y3), at the intersection point (X1, Y4) and at the intersection point (X1, Y5) are −0.03458, 0.02935, 0.026664 and −0.00723, respectively.

Similarly, based on calculations about X2, the warpages at the intersection point (X2, Y1), at the intersection point (X2, Y2), at the intersection point (X2, Y3), at the intersection point (X2, Y4) and at the intersection point (X2, Y5) are −0.03811, 0.025178, 0.07−47, 0.03751 and 0.05494, respectively.

That is, there is no warpage that exceeds 0.1 mm at all intersection points.

Similarly, as seen from the warpages at the intersection points of X3 to X10 with Y1 to Y5 in Table 3, there is no spot where the warpage exceeds 0.1 mm.

<A Warp State Table of the Printed Circuit Board in the Traditional Example: Table 4>

In contrast, for the printed circuit board of the traditional example, similarly, equal divided marks are made in the X direction at X1 to X10, and equal divided marks are made in the Y direction at Y1 to Y5, the warpage is calculated at the intersection point (X1, Y1), at the intersection point (X1, Y2), at the intersection point (X1, Y3), at the intersection point (X1, Y4), and at the intersection point (X1, Y5).

The result is shown in Table 4.

TABLE 4

Warping state of the circuit board of the traditional example

|    | X1       | X2       | X3       | X4       | X5       |
|----|----------|----------|----------|----------|----------|
| Y1 | −0.06815 | 0.001888 | 0.172738 | 0.016592 | 0.012872 |
| Y2 | 0.015418 | 0.125178 | −0.07328 | 0.067554 | 0.138338 |
| Y3 | 0.02935  | 0.07047  | −0.1043  | −0.07828 | −0.00756 |
| Y4 | 0.026664 | 0.03751  | −0.02786 | −0.02165 | 0.078778 |
| Y5 | 0.052766 | 0.05494  | 0.056066 | 0.047986 | 0.10182  |

|    | X6       | X7       | X8       | X9       | X10      |
|----|----------|----------|----------|----------|----------|
| Y1 | −0.07046 | 0.03008  | 0.13054  | −0.01018 | 0.071916 |
| Y2 | 0.196668 | 0.157478 | −0.06312 | 0.07979  | 0.00128  |
| Y3 | 0.024398 | 0.01725  | −0.05979 | 0.135298 | 0.037686 |

TABLE 4-continued

Warping state of the circuit board of the traditional example

|    |          |          |         |          |          |
|----|----------|----------|---------|----------|----------|
| Y4 | −0.04575 | 0.143582 | 0.02371 | 0.036632 | −0.00583 |
| Y5 | 0.13809  | 0.061512 | 0.09359 | −0.06945 | −0.07255 |

<There are a Number of Spots where the Warpage Exceeds 0.1 mm in Table 4>

As shown in Table 4, the warpages at the intersection point (X1, Y1), at the intersection point (X1, Y2), at the intersection point (X1, Y3), at the intersection point (X1, Y4) and at the intersection point (X1, Y5) are −0.06815, 0.015418, 0.02935, 0.026664 and 0.052766, respectively.

Similarly, based on calculations about X2, the warpages at the intersection point (X2, Y1), at the intersection point (X2, Y2), at the intersection point (X2, Y3), at the intersection point (X2, Y4) and at the intersection point (X2, Y5) are −0.001888, 0.125178, 0.07047, 0.13751 and 0.05494, respectively.

That is, the warpage at the intersection point (X2, Y2) is 0.125178 and the warpage at the intersection point (X2, Y4) is 0.13751, and thereby, there are some spots where the warpage exceeds 0.1 mm.

Similarly, as seen from the warpage at the intersection points of X3 to X10 with Y1 to Y5 in Table 4, there are a number of intersection points where the warpage exceeds 0.1 mm (0.172738 at the intersection point (X3, Y1), −0.1043 at the intersection point (X3, Y3), 0.138338 at the intersection point (X5, Y2), 0.10182 at the intersection point (X5, Y5), 0.196668 at the intersection point (X6, Y2), 0.10182 at the intersection point (X6, Y5), 0.157478 at the intersection point (X7, Y2), 0.143582 at the intersection point (X7, Y4), 0.13054 at the intersection point (X8, Y1) and 0.135298 at the intersection point (X9, Y3)).

<The Printed Circuit Board on which the Present Invention is Performed has No Concave/Convex Part that Exceeds 0.1 mm>

Figure 10:
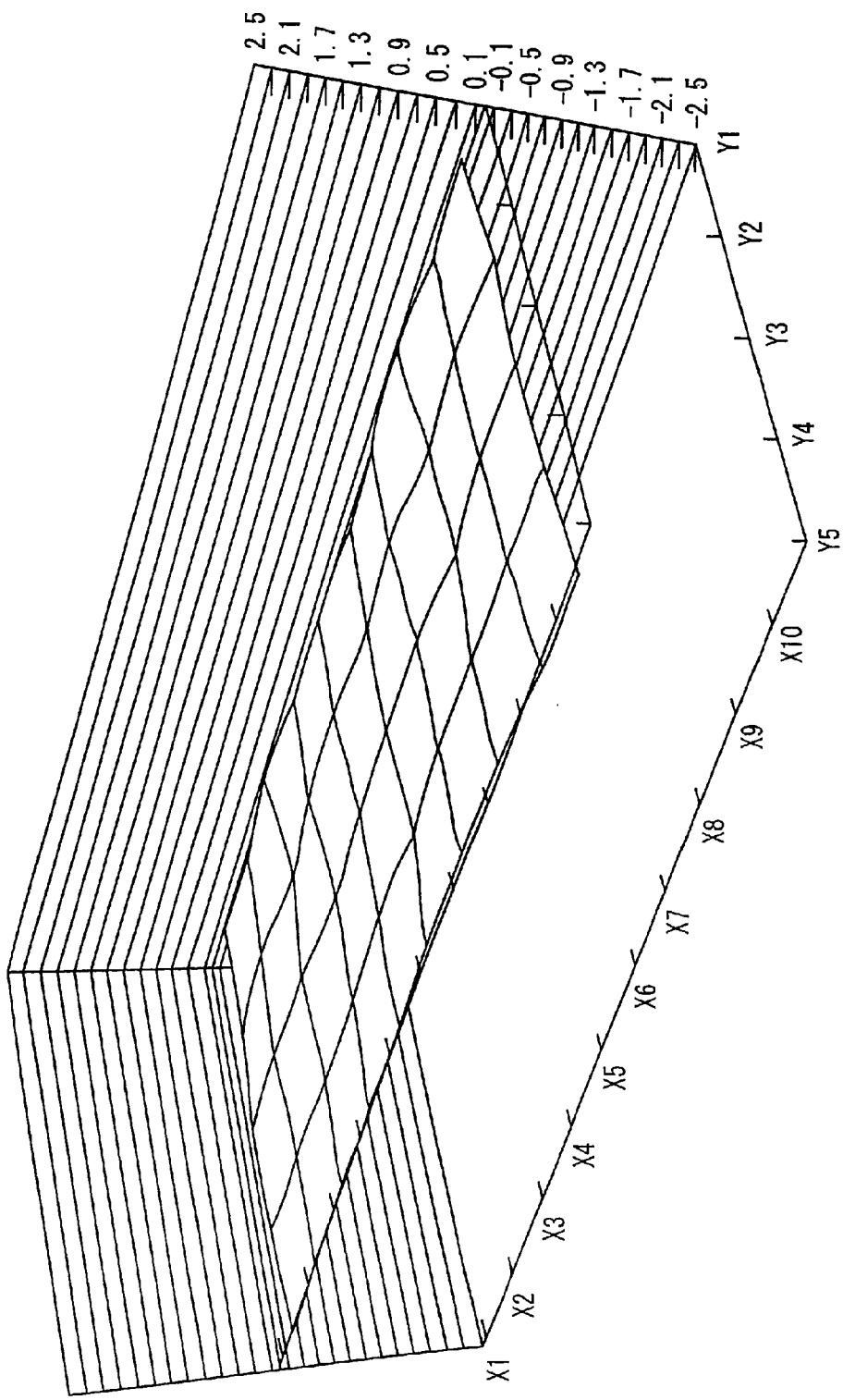
FIG. 10 is a perspective view of one example of the printed circuit board according to the present invention.
Figure 11:
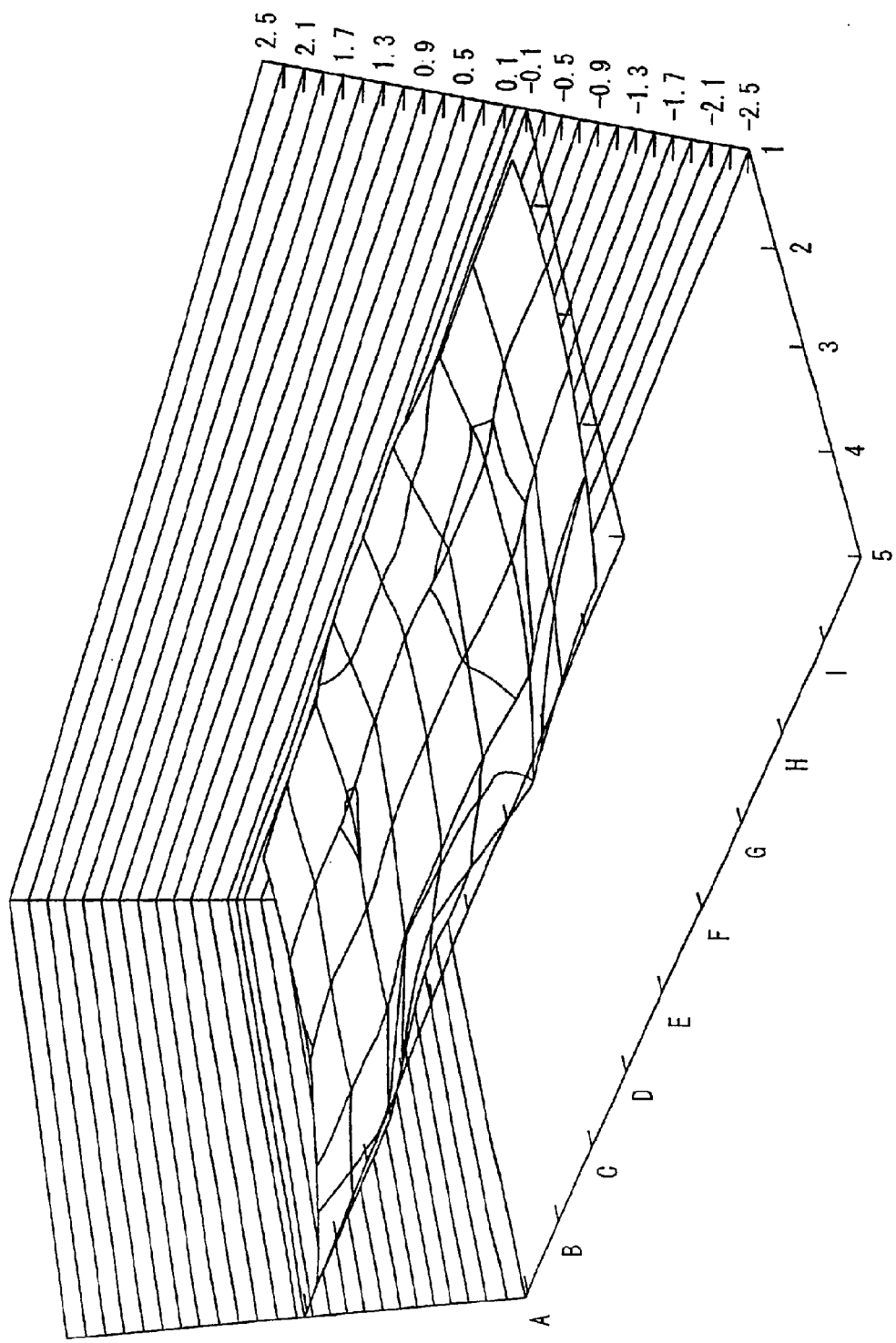
FIG. 11 is a perspective view of one example of traditional printed circuit board.

FIG. 10 is a perspective view of the printed circuit board in which the values in Table 3 is visualized, and FIG. 11 is a perspective view of the printed circuit board in which the values in Table 4 is visualized. The unit in the Z direction is mm in the figures.

For the printed circuit board on which the present invention is performed in FIG. 10, since there is no intersection point where the warpage exceeds 0.1 mm, when components are mounted, there are not the following problems. For example, the component is not well soldered, or the component is not in an automatic soldering reflow groove.

<There are a Number of Concave/Convex Parts Above 0.1 mm in the Printed Circuit Board of the Traditional Example>

In contrast, for the printed circuit board of the traditional example of FIG. 11, there are a number of intersection points where the warpage exceeds 0.1 mm, when components are mounted, there are the following problems. For example, the component is not well soldered, or the component is not in an automatic soldering reflow groove.

(Summary)

The present invention is summed up as follows.

An insulative board is divided into a plurality of divisions in a top view, since the front-back copper foil residual rate difference falls within a range of −10% to 10% in each division, a big density difference between the front surface and the back surface in each division is eliminated so that a big warp is not produced, since the difference between the front-back copper foil residual rate difference of adjacent divisions is small, a big warp is not produced at the adjacent divisions, and since there are not three or more consecutive divisions for which the difference between the front-back copper foil residual rate differences of adjacent divisions goes beyond a range of −5% to 5%, a big warp can be prevented from occurring as a whole.

Since the copper foil residual rate difference of adjacent divisions falls within the range of −20% to 20%, a big density difference at the division border is eliminated and the imbalance at the division border is reduced.

Since the difference between the front-back copper foil residual rate differences of a division under a surface mounted component which is soldered in more than one division and an adjacent division falls within the range of −5% to 5%, a big density difference at the division border is almost eliminated, the imbalance at the division border can be reduced and the soldering can be performed precisely.

Furthermore, since the solid copper foil is filled in the place with a low copper foil residual rate to adjust the copper foil residual rate in each division, the copper foil in each division can be not uneven and the imbalance in each division is reduced.

In this case, a number of holes are opened only in the solid copper foil to reduce the stress of the solid copper foil so that the copper foil balance can be adjusted.

The copper foil balance can be efficiently and precisely adjusted by opening holes with the size of 1 mm to 3 mm in diameter in a 5 mm*5 mm square.

When there are three consecutive divisions for which the difference between the front-back copper foil residual rate differences of the division and the adjacent division goes beyond a range of −5% to 5% but the divisions are at one end of the insulative board, since the end is forcibly fixed to an external object, it does not matter that there are three consecutive divisions for which the difference between the front-back copper foil residual rate differences goes beyond a range of −5% to 5%. In this way, the confirmation time for pattern design can be reduced.

What is claimed is:

1. A printed circuit board, comprising:
    a flat insulative board;
    a first circuit pattern provided on a front surface of the insulative board; and
    a second circuit pattern provided on a back surface of the insulative board, wherein the printed circuit board is designed to meet following requirements:
    a front-back copper foil residual rate difference (a−b) falls within a range of −10% to −1% and 1% to 10%, where the insulative board is divided into a plurality of divisions in a top view, in which a front surface copper foil residual rate and a back surface copper foil residual rate of each division are a% and b%, respectively;
    a difference ((a−b)−(c−d)) between front-back copper foil residual rate differences of adjacent divisions falls within a range of −10% to −1% and 1% to 10%, where the front surface copper foil residual rate and the back surface copper foil residual rate of a division adjacent to the each division are c % and d %, respectively; and
    there are not three or more consecutive divisions for which the difference ((a−b)−(c−d)) between the front-back copper foil residual rate differences goes beyond a range of −5% to −1% and 1% to 5%.

2. The printed circuit board according to claim 1, wherein a value (a−c) falls within a range of −20% to 20% and a value (b−d) falls within a range of −20% to 20%.

3. The printed circuit board according to claim 2, wherein a difference ((a−b)−(c−d)) between the front-back copper foil residual rate differences of a first division under a surface mounted component which is soldered in more than one division and a second division adjacent to the first division falls within a range of −5% to 5%.

4. The printed circuit board according to claim 1, wherein a solid copper foil is filled in a place with a lower copper foil residual rate than a predetermined rate to adjust the copper foil residual rate in each division.

5. The printed circuit board according to claim 4, wherein a number of holes are opened in the solid copper foil to reduce a stress of the solid copper foil.

6. The printed circuit board according to claim 5, wherein a size of the holes is any of 1 mm to 3 mm in diameter in a 5 mm*5 mm square.

7. A printed circuit board, comprising:
    a flat insulative board;
    a first circuit pattern provided on a front surface of the insulative board; and
    a second circuit pattern provided on a back surface of the insulative board, wherein the printed circuit board is designed to meet following requirements:
    a front-back copper foil residual rate difference (a−b) falls within a range of −10% to −1% and 1% to 10%, where the insulative board is divided into a plurality of divisions in a top view, in which a front surface copper foil residual rate and a back surface copper foil residual rate of each division are a % and b %, respectively;
    a difference ((a−b)−(c−d)) between front-back copper foil residual rate differences of adjacent divisions falls within a range of −10% to −1% and 1% to 10%, where the front surface copper foil residual rate and the back surface copper foil residual rate of a division adjacent to the each division are c % and d %, respectively; and
    it is permitted there are three or more consecutive divisions for which the difference ((a−b)−(c−d)) between the front-back copper foil residual rate differences of adjacent divisions goes beyond the range of −5% to −1% and 1% to 5% in a vertical direction or in a horizontal direction on a plane of the insulative board in the three or more consecutive divisions at one end of the insulative board, and
    there are not three or more consecutive divisions for which the difference ((a−b)−(c−d)) between the front-back copper foil residual rate differences goes beyond a range of −5% to −1% and 1% to 5% in the three or more consecutive divisions other than the end of the insulative board.

* * * * *